United States Patent
Kobayashi

(10) Patent No.: US 6,593,521 B2
(45) Date of Patent: Jul. 15, 2003

(54) POWER CONVERTER INTEGRATED SOLAR CELL MODULE

(75) Inventor: Takuma Kobayashi, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,101

(22) Filed: Oct. 29, 2001

(65) Prior Publication Data

US 2002/0050290 A1 May 2, 2002

(30) Foreign Application Priority Data

Oct. 31, 2000 (JP) ........................................ 2000-332898

(51) Int. Cl.[7] ............................................. H01L 31/042
(52) U.S. Cl. ....................... 136/244; 136/251; 136/291; 136/293; 323/906; 363/13; 363/60
(58) Field of Search ................................ 136/244, 251, 136/291, 293; 323/906; 363/13, 60

(56) References Cited

U.S. PATENT DOCUMENTS

| | | | | |
|---|---|---|---|---|
| 4,217,633 A | * | 8/1980 | Evans, Jr. ..................... | 363/27 |
| 5,545,261 A | | 8/1996 | Ganz et al. ................. | 136/251 |
| 5,951,785 A | * | 9/1999 | Uchihashi et al. .......... | 136/251 |
| 2002/0038666 A1 | * | 4/2002 | Toyomura et al. .......... | 136/256 |
| 2002/0078991 A1 | * | 6/2002 | Nagao et al. ................ | 136/251 |
| 2002/0179140 A1 | * | 12/2002 | Toyomura .................... | 136/251 |
| 2002/0186020 A1 | * | 12/2002 | Kondo et al. ................ | 324/538 |

FOREIGN PATENT DOCUMENTS

| | | | |
|---|---|---|---|
| DE | 19508250 A1 | * | 9/1996 |
| JP | 5-82819 | | 4/1991 |
| JP | 9-201061 A | * | 7/1997 |
| JP | 9-271179 | | 10/1997 |
| JP | 2000-59986 | | 9/1999 |
| JP | 2000-77700 A | * | 3/2000 |

OTHER PUBLICATIONS

Kurokawa et al, "Conceptual considerations on PV systems composed of AC modules," Solar Energy Materials and Solar Cells, 47 (1997) 243–250.*

* cited by examiner

Primary Examiner—Alan Diamond
(74) Attorney, Agent, or Firm—Fitzpatrick, Cella, Harper & Scinto

(57) ABSTRACT

This invention is a power converter integrated solar cell module having a power converter mounted on the rear surface of a solar cell module. This solar cell module has a structure by which the power converter is attached to a low-temperature portion on the solar cell module rear surface.

17 Claims, 8 Drawing Sheets

151 LOW-EFFICIENCY SOLAR CELL

11 REAR-SURFACE REINFORCER

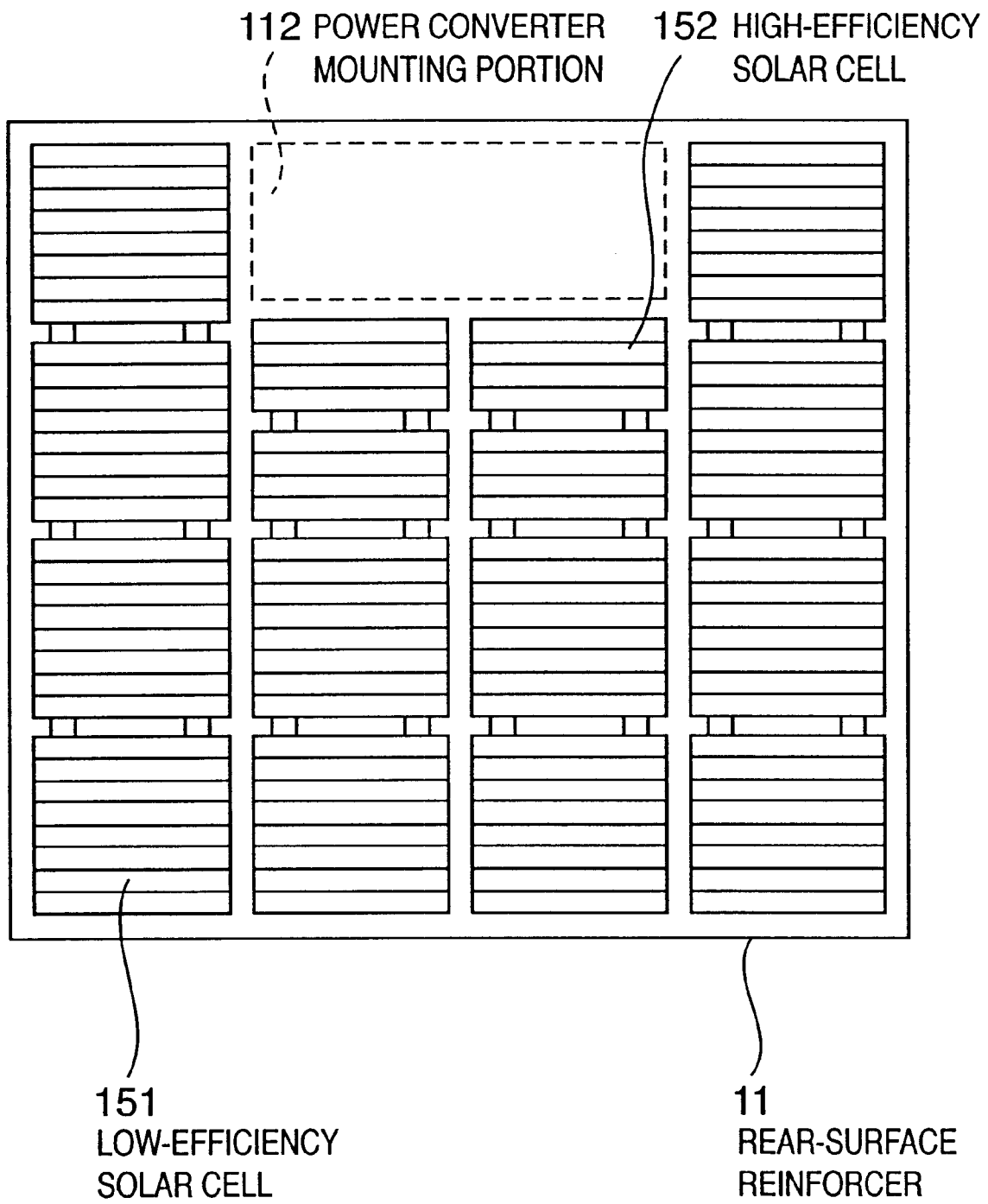

POWER CONVERTER INTEGRATED SOLAR CELL MODULE

FIELD OF THE INVENTION

The present invention relates to a power converter integrated solar cell module having a power converter mounted on the rear surface of a solar cell module.

BACKGROUND OF THE INVENTION

Presently, the global environment has increasingly attracted attention, so research and development of solar-light power generating systems have been extensively made. The form of solarlight power generating systems (photovoltaic power generating systems) presently widely used is that a plurality of solar cell modules are connected in series to construct a solar cell array, and electric powers from these solar cell modules are collected and input to a power converter.

Recently, however, a power converter integrated solar cell module has spread which is obtained by mounting a power converter having the same capacity as that of one solar cell module on the rear surface of the solar cell module.

Compared to the conventional solarlight power generating systems, this power converter integrated solar cell module has the following advantages:

DC circuit wiring can be omitted.

Cost reduction by the inverter mass production effect can be expected.

Since maximum power point control is performed for each module, the power unbalance when an array circuit is installed can be minimized.

The solar cell module can be installed in any place because the commercial frequency/standard voltage is readily obtainable by one module.

Unfortunately, this power converter integrated solar cell module has the following problems.

The temperature of the front surface of the solar cell module reaches 70° C. to 80° C. in midsummer, and the heat is conducted to the rear surface to increase its temperature. Therefore, if an inverter is simply mounted on the rear surface of the solar cell module, the heat conducted from the front surface heats the inverter to interfere with heat dissipation of the inverter, thereby lowering the conversion efficiency. In the worst case, the heat may destroy internal electric devices of the inverter.

To solve this problem, Japanese Patent Laid-Open No. 9-271179 has proposed a structure in which an inverter is mounted on the rear surface of the solar cell module with a spacing between them.

If, however, an inverter is mounted with a spacing, a projection on the rear surface of the solar cell module increases. This restricts a place where the solar cell module can be installed, reducing the merit of the power converter integrated solar cell module that it can be used in various places.

Also, a special member is necessary to mount an inverter on the rear surface of the solar cell module with a spacing between them, and the assembly process is complicated. This increases the manufacturing cost.

SUMMARY OF THE INVENTION

The present invention has been proposed to solve the conventional problems, and has as its object to provide a low-cost, high-reliability power converter integrated solar cell module.

According to a preferred aspect of the present invention, the foregoing object is attained by providing a power converter integrated solar cell module comprising a solar cell module, and a power converter attached to a relatively-low-temperature portion on the rear surface of the solar cell module.

The present invention is characterized in that the power converter is attached to the end portion of the solar cell module.

The present invention is characterized in that a solar cell installation area is made smaller than the area of the rear-surface reinforcer of the solar cell module, and the power converter is attached to a portion of the solar cell module rear surface where no solar cell is present.

The present invention is characterized in that a solar cell installation area is made smaller than the area of the rear-surface reinforcer of the solar cell module, a surface of the rear-surface reinforcer on which the solar cell is placed has a color different from that of the surface of the solar cell, and the power converter is mounted on the solar cell module rear surface whose color has a higher light reflectance of the two colors.

The present invention is characterized in that a solar cell installation area is made smaller than the area of the rear-surface reinforcer of the solar cell module, at least part of a portion where no solar cell is placed of a surface of the rear-surface reinforcer on which the solar cell is placed has a color having a light reflectance higher than that of the surface of the solar cell, and the power converter is mounted on the solar cell module rear surface in that portion.

The present invention is characterized in that the light reflectance of a covering material in a portion of the solar cell module where no solar cell is present is made higher than that of the covering material in a portion where the solar cell is present, and the power converter is mounted on the solar cell module rear surface in the portion where no solar cell is present.

The present invention is characterized in that the external color of the power converter has a light reflectance higher than that of the color of the solar cell module rear surface.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 shows a solar cell module used in the fourth embodiment of the present invention.

DETAILED DESCRIPTION OF THE PREFERRED EMBODIMENTS

Preferred embodiments of the present invention will now be described in detail in accordance with the accompanying drawings.

<First Embodiment>

[Solar Cell Module]

A solar cell module used in this embodiment will be explained below.

Figure 1:
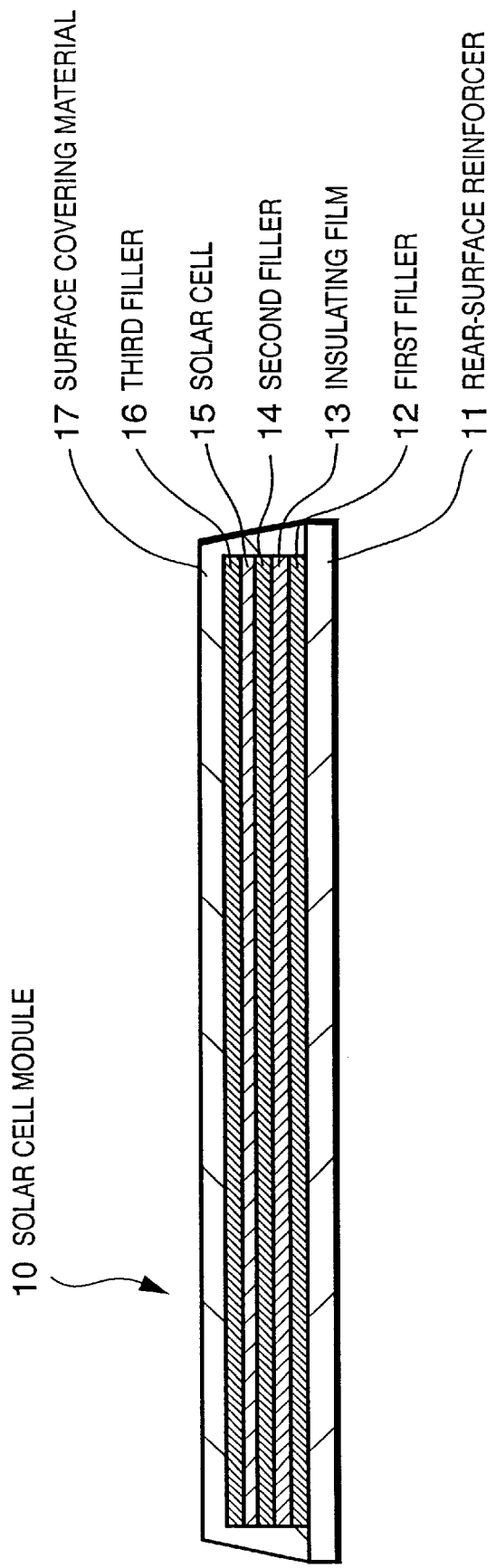
FIG. 1 shows a solar cell module used in the first embodiment of the present invention.

In this embodiment, a zinc-coated steel plate 50 cm wide and 120 cm long, having a light receiving surface (a surface on which a solar cell is stacked) colored in white, was used as a rear-surface reinforcer. As shown in FIG. 1, a first filler 12 (EVA (ethylene-vinyl acetate copolymer)), an insulating film 13 (nylon), and a second filler 14 (EVA) were stacked in this order on this rear-surface reinforcer 11. On top of the structure, a Canon amorphous silicon solar cell 15 (20 cm×40 cm) was stacked. The surface color of this Canon amorphous silicon solar cell 15 is dark blue. Generally, the surface color of a solar cell can be changed by the thickness of an antireflection film layer. In addition, a third filler 16 (EVA) and a surface covering material 17 (fluororesin film) were stacked on the solar cell 15. Lamination was performed by melting the fillers by placing the resultant structure in a vacuum at a temperature of 150° C., thereby manufacturing a solar cell module 10.

The manufactured solar cell module was horizontally set in an environment testing laboratory, and the internal temperature of this testing laboratory was set at 27° C. The solar cell module was irradiated for a predetermined time (here, for one hour) with solar radiation energy (1.0 kW/m$^2$) using a metal halide lamp, and the temperature of the rear surface of the solar cell module was measured.

Consequently, the highest temperature of the rear surface of the solar cell module in a portion where the dark-blue solar cell was stacked was 61° C., and that of the rear surface (the surface color was white) of the solar cell module in a portion where no solar cell was stacked was 55° C. That is, a temperature difference of 6° C. was observed between them.

[Power Converter]

A power converter for use in the present invention can be an inverter which converts a DC power into an AC power, or a DC/DC converter which converts a DC voltage into an arbitrary DC voltage. In this embodiment, therefore, an inverter (10 cm long, 20 cm wide, and 2 cm thick) is used to output an AC power by converting an output DC power from the solar cell into a set voltage value. This power converter includes a main circuit primarily composed of a boosting chopper, a boosting transformer, and a DC/AC conversion circuit, and a control circuit which performs activation/stop, optimum solar cell operation (for instance, Maximum Power Point tracks), system protection, and the like.

[Power Converter Integrated Solar Cell Module]

Figure 2:
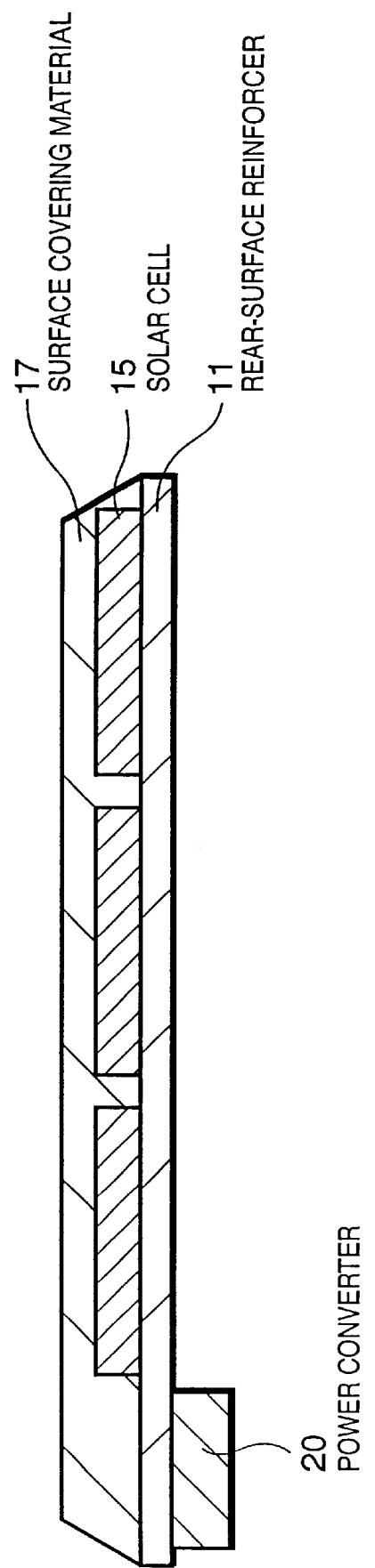
FIG. 2 shows a power converter integrated solar cell module according to the first embodiment of the present invention.

A power converter integrated solar cell module was manufactured by using the solar cell module and the power converter explained above. In the power converter integrated solar cell module according to this embodiment, as shown in FIG. 2, a power converter 20 is attached to a portion of the rear-surface reinforcer 11 of the solar cell module, where there is no solar cell 15 on the light receiving surface covered with the surface covering material 17, via an adhesive layer made of a silicone adhesive agent.

In this embodiment as described above, on the surface of the solar cell module, the color of the solar cell is designed to be different from that of a portion of the solar cell module where no solar cell is present, and the power converter is mounted on the rear surface of one of these two portions the color of which has a lower heat absorbance. This reduces the influence of heat conducted from the solar cell module light receiving surface to the power converter, thereby preventing defective operations and failures of the power converter caused by heat. Accordingly, a highly reliable power converter integrated solar cell module can be provided.

In this embodiment, a zinc-coated steel plate is used as the rear-surface reinforcer of the solar cell module. However, it is also possible to use, e.g., a fluoroplastic, acrylic plate, or silicone resin sheet. This rear-surface reinforcer need only reinforce and protect the solar cell device from the rear surface. However, to prevent the conduction of heat from the light receiving surface to the rear surface, it is desirable to select a material having the highest heat resistance as this rear-surface reinforcer.

Also, when a material having a heat insulating function is used as the adhesive layer for adhering the solar cell module and the power converter, the amount of heat conducted from the front surface to the rear surface of the solar cell module reduces. This can decrease the temperature rise of the power converter.

In this embodiment, the reflectance of the color of the rear-surface reinforcer on the light receiving surface side is designed to be higher than that of the surface color of the solar cell, and the power converter is attached to a portion where no solar cell is present.

It is also possible to make the reflectance of the solar cell higher and mount the power converter on the rear surface of the solar cell. In this arrangement, however, the power generated by the solar cell lowers, and this solar cell generated power is further lowered by heat radiated from the power converter mounted on the rear surface of the solar cell. Therefore, the arrangement of this embodiment is preferred.

Furthermore, when the external color of the power converter mounted on the rear surface is designed to have a high reflectance, a temperature rise when the power converter is irradiated with direct or scattered solarlight can be prevented.

In addition, in the power converter integrated solar cell module according to the present invention, the power converter can be constructed by a temperature rise allowing portion having a large temperature rise allowable range and a non-temperature rise allowing portion having a temperature rise allowable range narrower than that of the temperature rise allowing portion. In this arrangement, the non-temperature rise allowing portion of the power converter is attached to a low-temperature portion of the solar cell module rear surface.

<Second Embodiment>

The second embodiment of the present invention will be described below.

[Solar Cell Module]

A solar cell module used in this embodiment will be explained below.

Figure 3:
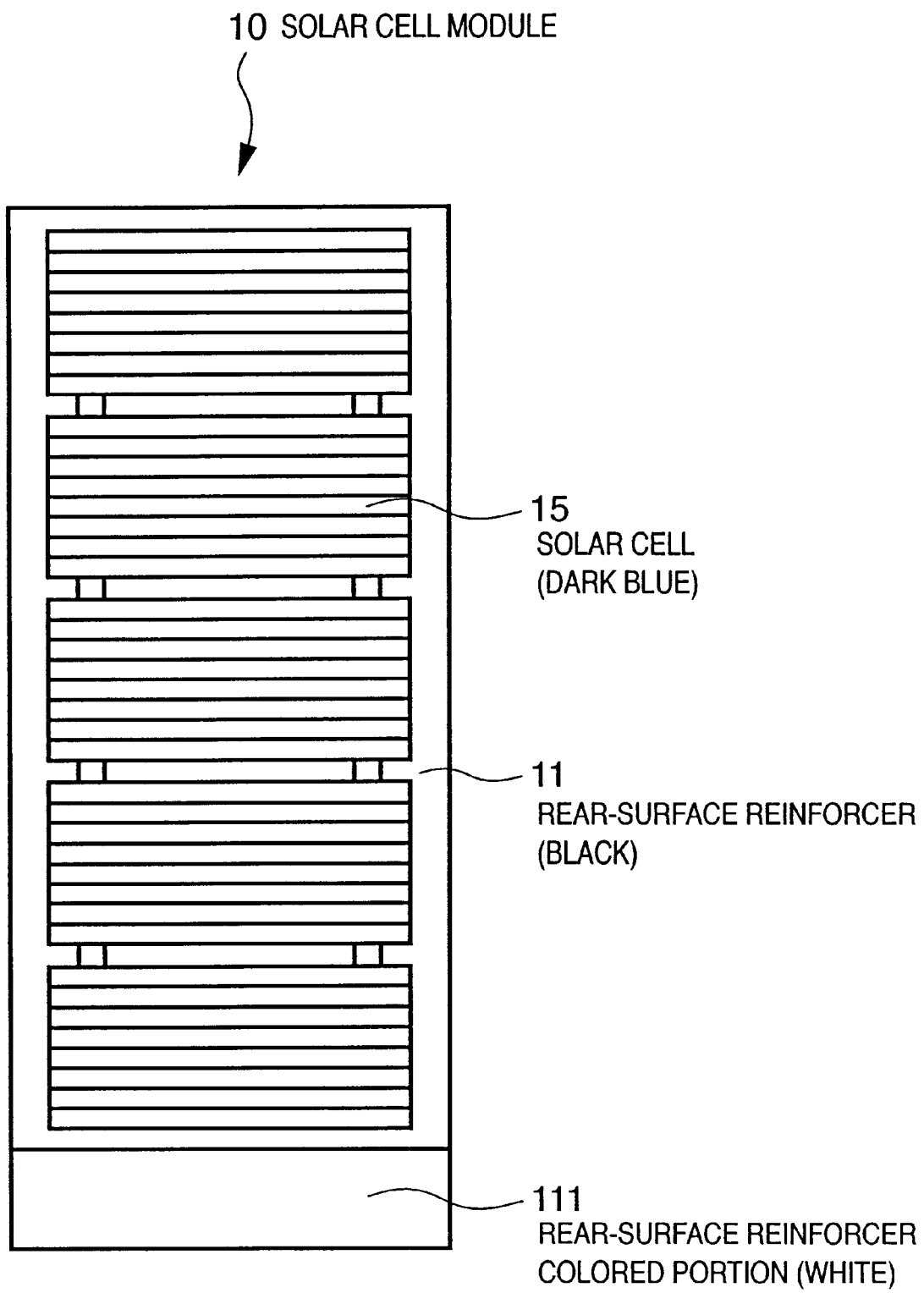
FIG. 3 shows a solar cell module used in the second embodiment of the present invention.

In this embodiment, a zinc-coated steel plate 50 cm wide and 120 cm long, having a light receiving surface (a surface on which a solar cell is stacked) colored in black, was used as a rear-surface reinforcer. In addition, as shown in FIG. 3, a portion (20 cm×50 cm) of the light receiving surface was colored in white with a heat-resistant reflecting paint to form a rear-surface reinforcer colored portion 111. On this rear-surface reinforcer 11, as in the first embodiment, a first filler, insulating film, second filler, Canon amorphous silicon solar cell, third filler, and surface coating material were stacked, thereby manufacturing a solar cell module 10. As shown in FIG. 3, solar cells 15 were arranged in a portion except for the white-colored portion on the rear-surface reinforcer.

Following the same procedure as in the first embodiment, the manufactured solar cell module was irradiated with light, and the temperature of the solar cell module rear surface was measured. Consequently, the highest temperature of the rear surface of the solar cell module in a portion where the dark-blue solar cell was stacked was 62° C., and that of the rear surface in a portion where the light receiving surface was colored in white was 57° C. That is, a temperature difference of 5° C. was observed between them.

[Power Converter Integrated Solar Cell Module]

Figure 4:
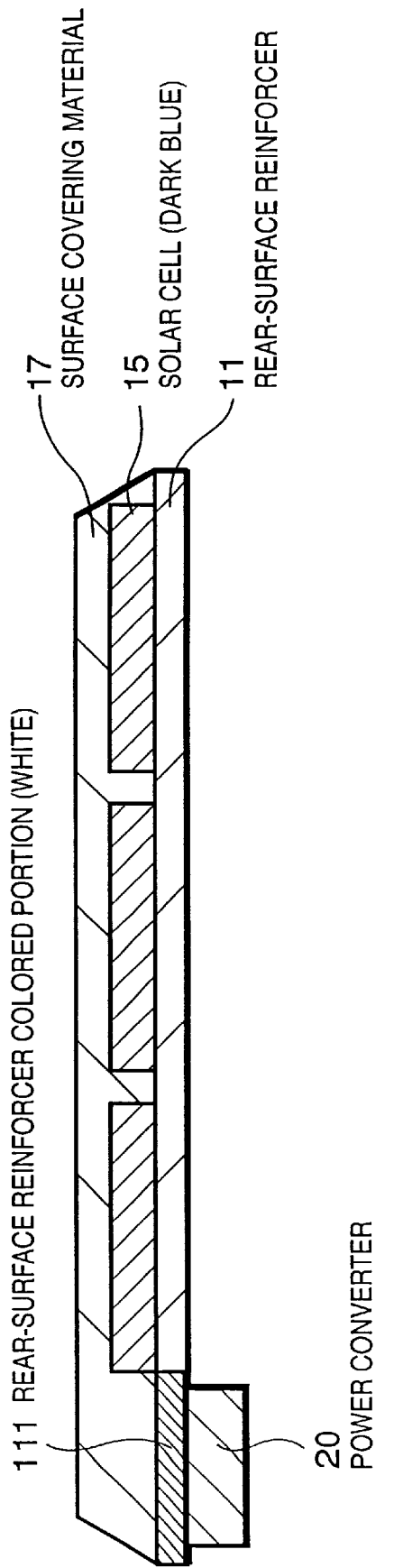
FIG. 4 shows a power converter integrated solar cell module according to the second embodiment of the present invention.

A power converter integrated solar cell module was manufactured by using the solar cell module explained above and a power converter. In the power converter integrated solar cell module according to this embodiment, as shown in FIG. 4, a power converter 20 is mounted, via an adhesive layer made of a silicone adhesive agent, on the rear surface of the rear-surface reinforcer colored portion 111, which is a portion of the rear-surface reinforcer 11 of the solar cell module in which the light receiving surface is colored in white. In this embodiment as described above, the color of a portion of the solar cell module surface has a heat absorbance smaller than that of the surface color of the solar cell 15, and the power converter is mounted on the rear surface of that portion. This reduces the influence of heat conducted from the solar cell module light receiving surface covered with a surface covering material 17 to the power converter, thereby preventing defective operations and failures of the power converter caused by heat. Accordingly, a highly reliable power converter integrated solar cell module can be provided.

<Third Embodiment>

The third embodiment of the present invention will be described below.

[Solar Cell Module]

Differences of a solar cell module used in this embodiment from the first and second embodiments will be explained below.

In this embodiment, a portion in which no solar cell is placed of a surface covering material for covering the surface of a solar cell module is partially colored in white. Examples of a method of coloring the covering material are a method of coloring the surface of the covering material by screen printing or the like, and a method using a dye or a pigment (an azo-based pigment or a phthalocyanine-based pigment) having a resistance to light and heat.

By using this partially colored surface covering material, layers are stacked and laminated as in the previous embodiments to manufacture a solar cell module. Caution should be exercised on alignment so that the colored covering material does not overlap a solar cell.

Following the same procedure as in the first and second embodiments, the manufactured solar cell module was irradiated with light, and the temperature of the solar cell module rear surface was measured. Consequently, the highest temperature of the rear surface of the solar cell module in a portion where the dark-blue solar cell was stacked was 62° C., and that of the rear surface in a portion where the light receiving surface was colored in white was 54° C. That is, a temperature difference of 8° C. was observed between them.

[Power Converter Integrated Solar Cell Module]

Figure 5:
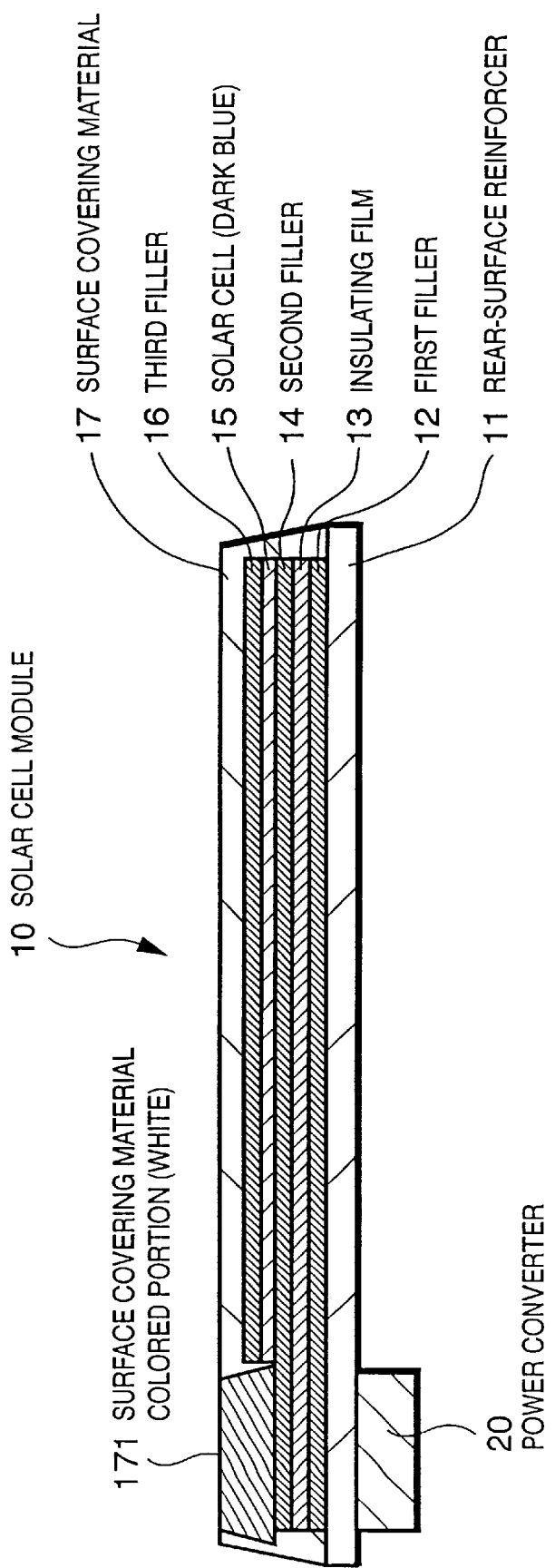
FIG. 5 shows a solar cell module used in the third embodiment of the present invention.

A power converter integrated solar cell module was manufactured by using the solar cell module explained above and a power converter. In the power converter integrated solar cell module according to this embodiment, as shown in FIG. 5, a power converter 20 is mounted, via an adhesive layer made of a silicon adhesive agent, on the rear surface of a rear-surface reinforcer in a surface covering material colored portion 171, which is a portion where the surface covering material is colored in white.

If a low-temperature portion of the solar cell module is smaller than the contact surface area between the power converter and the solar cell module, a portion having a small temperature rise margin is desirably attached to the low-temperature portion of the solar cell module. Generally, a high-frequency transformer or a power switching element which is a main circuit portion of an inverter has a small temperature rise margin. Therefore, this portion is preferably attached to the low-temperature portion of the solar cell module.

In this embodiment as described above, the color of a portion of a surface covering material 17 covering the surface of the solar cell module 10 has a heat absorbance smaller than that of the surface color of the solar cell, and the power converter is mounted on the rear surface of that portion. As in the first and second embodiments, this reduces the influence of heat conducted from the solar cell module light receiving surface to the power converter, thereby preventing defective operations and failures of the power converter caused by heat. Accordingly, a highly reliable power converter integrated solar cell module can be provided.

Although the surface covering material 17 is colored in this embodiment, the same effect can be obtained by similarly coloring fillers. Also, filler alignment can be simplified by coloring fillers (a first filler 2 and a second filler 13) stacked below a solar cell 15.

<Fourth Embodiment>

The fourth embodiment of the present invention will be described below.

[Solar Cell Module]

In the first to third embodiments described above, a portion where no solar cell is present is formed on the surface of a solar cell module, and this portion is colored to have a high light reflectance to form a low-temperature portion on the rear surface of a solar cell. However, when a portion where no solar cell is present is thus formed on the surface of a solar cell module, the electric power generated by the solar cell module itself reduces. Therefore, it is an object of this embodiment to prevent a reduction in the generated power of a solar cell module caused by a reduction in the installation area of solar cells, by using a solar cell having a high photoelectric conversion efficiency.

Figure 6:
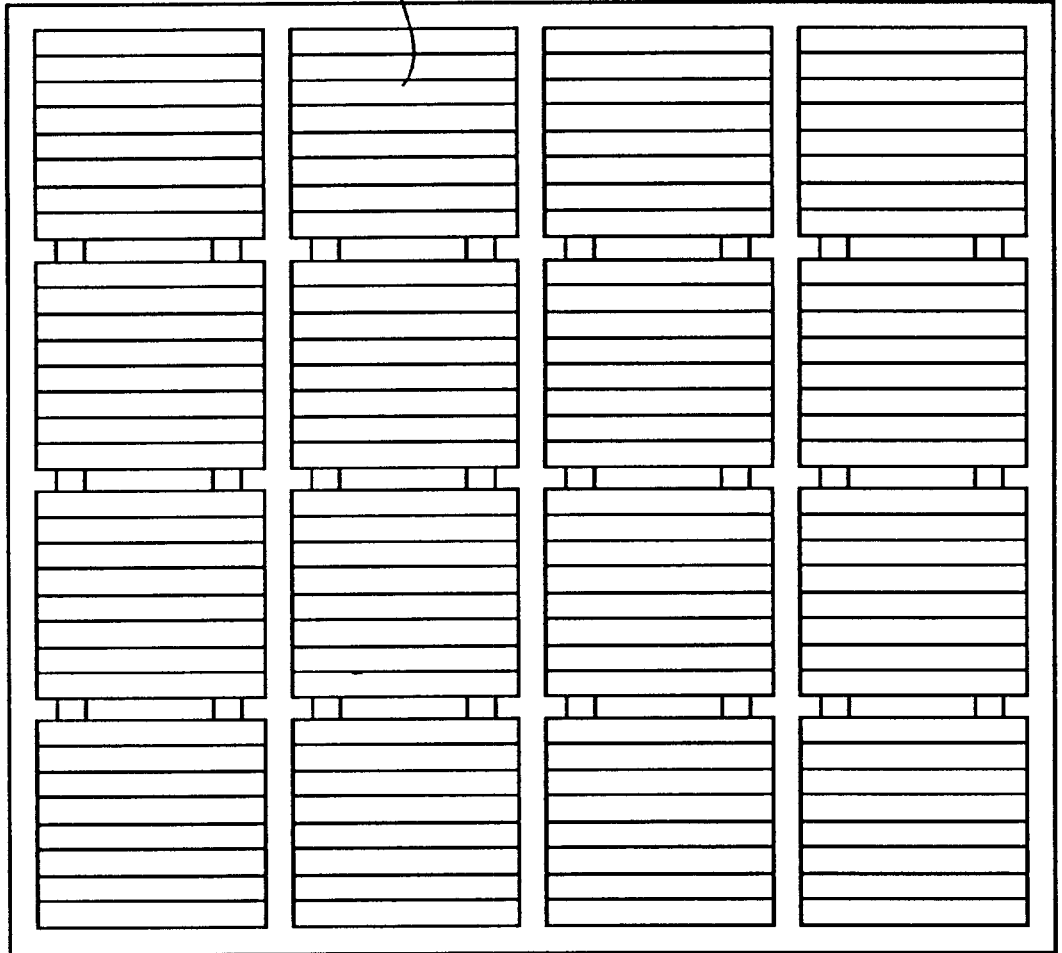
FIG. 6 shows a solar cell module used in the fourth embodiment of the present invention.
Figure 7:
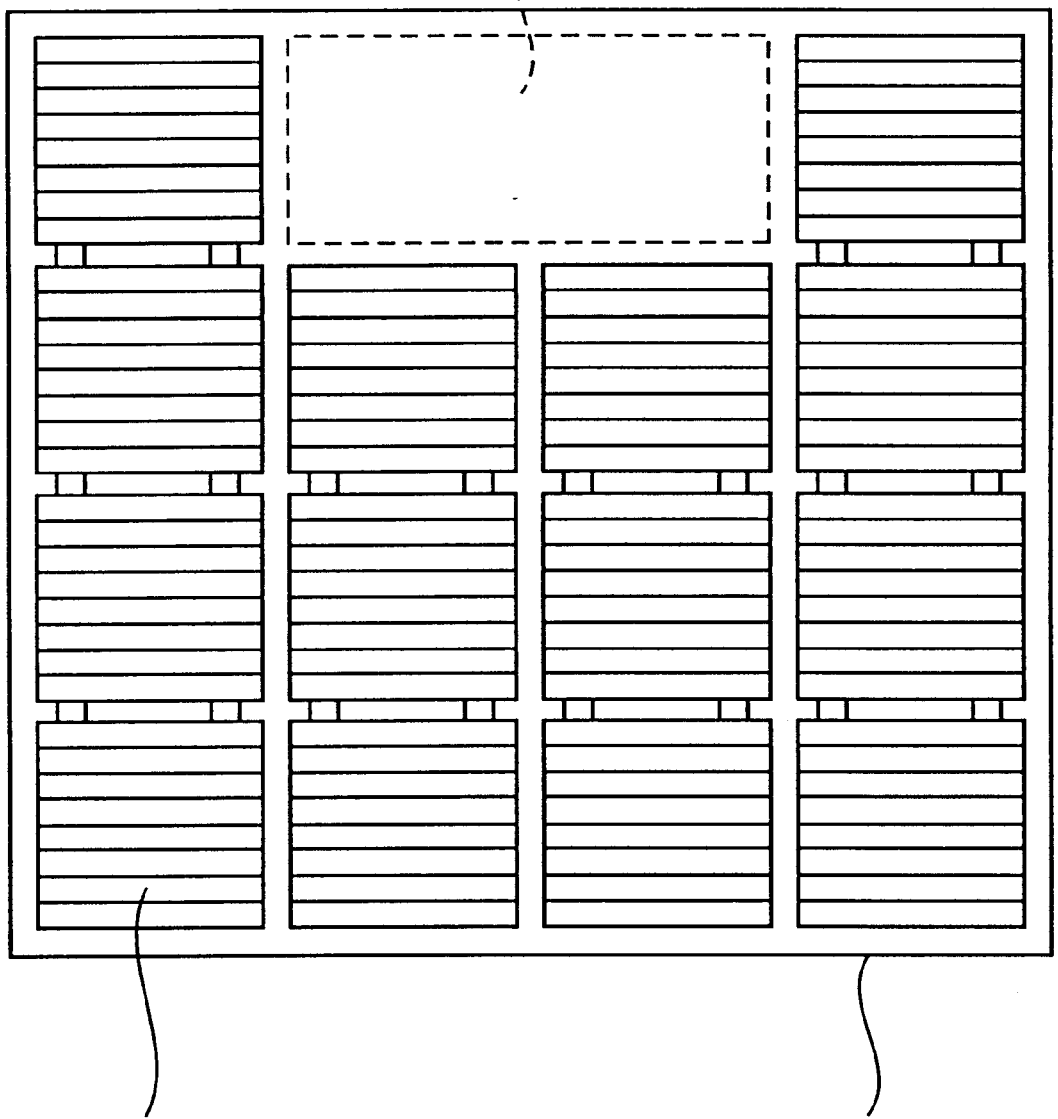
FIG. 7 shows a solar cell module used in the fourth embodiment of the present invention.

More specifically, as shown in FIG. 6, a power converter integrated solar cell module is manufactured by using a solar cell module (rated operating voltage=16 V, rated operating current=10 A, rated output=160 W, and photoelectric conversion efficiency=8%) in which 16 low-efficiency solar cells 151 having a rated operating voltage of 2 V, a rated operating current of 5 A, a rated output of 10 W, and a photoelectric conversion efficiency of 8% are arranged on a rear-surface reinforcer 11 such that two parallel rows of eight series-connected cells are formed. If a low-temperature portion (power converter mounting portion 112) is formed by removing two low-efficiency solar cells 151 on the rear-surface reinforcer 11 as shown in FIG. 7 in order to mount a power converter, the rated operating voltage, rated operating current, and rated output of the solar cell module become 14 V, 5 A, and 70 W, respectively, and the generated power of the solar cell module reduces by 10 W. As shown in FIG. 8, therefore, high-efficiency solar cells 152 (rated operating voltage=2 V, rated operating current=5 A, rated output=10 W, and photoelectric conversion efficiency=16%) each having an area half that of the low-efficiency solar cell 151 and a photoelectric conversion efficiency twice that of the low-efficiency solar cell 151 are used. In this case, a solar cell module having a rated operating voltage of 16 V, a rated operating current of 10 A, and a rated output of 160 W can be constructed.

The rest is the same as the other embodiments described previously, so a detailed description thereof will be omitted.

As described above, by constructing a solar cell module by using two or more types of solar cells different in photoelectric conversion efficiency, it is possible to prevent a reduction in the generated power of the solar cell module caused by a reduction in the installation area of solar cells.

<Fifth Embodiment>

The fifth embodiment according to the present invention will be described below.

In this embodiment, a method of forming a low-temperature portion on the rear surface of a solar cell module, different from the above embodiment, will be explained.

In this embodiment, a power converter integrated solar cell module is seldom horizontally set unlike common solar cell modules, but is fixed at a predetermined angle of elevation in order to receive sunlight as much as possible. Since warm air flows up by natural convection on the rear surface of the solar cell module, the temperature in the upper portion of the solar cell module is higher than that in its lower portion. Hence, the mounting position of a power converter is formed at the end portion of the solar cell module rear surface, and this portion is set on the lower side along the vertical direction. This can decrease a temperature rise of the power converter and thereby increase its reliability. The reliability of the power converter can be further increased by combining the power converter integrated solar cell module of this embodiment with the arrangements of the first to fourth embodiments described above.

Furthermore, a solarlight power generating system can be constructed by connecting, in series and parallel, a plurality of power converter integrated solar cell modules described above.

As has been described above, the present invention can provide a low-cost, high-reliability power converter integrated solar cell module having a power converter mounted on the rear surface of a solar cell module, by forming a relatively-low-temperature portion on the solar cell module rear surface and attaching the power converter to this portion.

The present invention is not limited to the above embodiments and various changes and modifications can be made within the spirit and scope of the present invention. Therefore, to apprise the public of the scope of the present invention, the following claims are made.

What is claimed is:

1. A power converter integrated solar cell module comprising:
   a solar cell module; and
   a power converter attached to a relatively-low-temperature portion on a rear surface of said solar cell module.

2. The module according to claim 1, wherein said power converter converts an output DC power from a solar cell into an AC power.

3. The module according to claim 1, wherein said power converter outputs a DC power by converting an output DC power from a solar cell into a set voltage value.

4. The module according to claim 1, wherein said power converter is attached to an end portion of said solar cell module.

5. The module according to claim 1, wherein said solar cell module comprises a rear-surface reinforcer, and at least one solar cell placed on said rear-surface reinforcer.

6. The module according to claim 5, wherein a solar cell installation area is made smaller than the area of said rear-surface reinforcer of said solar cell module, and said power converter is attached to a portion of the solar cell module rear surface where no solar cell is present.

7. The module according to claim 5, wherein a solar cell installation area is made smaller than the area of said rear-surface reinforcer of said solar cell module, a surface of said rear-surface reinforcer on which said solar cell is placed has a color different from that of the surface of said solar cell, and said power converter is mounted on the solar cell module rear surface whose color is the one having a higher light reflectance of the two colors.

8. The module according to claim 5, wherein a solar cell installation area is made smaller than the area of said rear-surface reinforcer of said solar cell module, at least a portion where no solar cell is placed of a surface of said rear-surface reinforcer on which said solar cell is placed has a color having a light reflectance higher than that of the surface of said solar cell, and said power converter is mounted on the solar cell module rear surface in that portion.

9. The module according to claim 1, wherein a side of said solar cell module at which light is incident on a solar cell is covered with a covering material.

10. The module according to claim 9, wherein the light reflectance of the covering material in a portion of said solar cell module where no solar cell is present is made higher than that of the covering material in a portion where said solar cell is present, and said power converter is mounted on the solar cell module rear surface in the portion where no solar cell is present.

11. The module according to claim 10, wherein a light receiving surface of the covering material of said solar cell module in the portion where said solar cell is present has a texture structure, a light receiving surface of the covering material in the portion where no solar cell is present has a plane structure, and said power converter is mounted on the solar cell module rear surface in the portion where no solar cell is present.

12. The module according to claim 10, wherein the color of the covering material in the portion of said solar cell module where no solar cell is present has a light reflectance higher than that of said solar cell, and said power converter is mounted on the solar cell module rear surface in the portion where no solar cell is present.

13. The module according to claim 1, wherein said power converter comprises a temperature rise allowing portion having a temperature rise allowable range, and a non-temperature rise allowing portion having a temperature rise allowable range narrower than that of the temperature rise allowing portion, and the non-temperature rise allowing portion is attached to the relatively-low-temperature portion on the solar cell module rear surface.

14. A photovoltaic power generating system characterized by being constructed by connecting, in series and parallel, a plurality of power converter integrated solar cell modules according to claim 1.

15. A power converter integrated solar cell module installation method of installing a power converter integrated solar cell module according to claim 4 at an arbitrary angle of elevation to a horizontal plane, comprising an installing step of installing said power converter integrated solar cell module with a power converter mounted portion facing down.

16. A power converter integrated solar cell module comprising:

a solar cell module; and a power converter attached to a relatively-low-temperature portion on a rear surface of said solar cell module, wherein said solar cell module comprises a rear-surface reinforcer, and at least one solar cell placed on said rear-surface reinforcer, a solar cell installation area is made smaller than the area of said rear-surface reinforcer of said solar cell module, and said power converter is attached to a portion of the solar cell module rear surface where no solar cell is present, and said solar cell module comprises not less than two types of solar cells different in photoelectric conversion efficiency.

17. A power converter integrated solar cell module comprising:

a solar cell module; and a power converter attached to a relatively-low-temperature portion on a rear surface of said solar cell module, wherein the external color of said power converter has a light reflectance higher than that of the color of the solar cell module rear surface.

* * * * *